US012658931B2

(12) United States Patent
Gutman et al.

(10) Patent No.: US 12,658,931 B2
(45) Date of Patent: Jun. 16, 2026

(54) ANALOG-TO-DIGITAL CONVERTER NON-LINEARITY MODEL ESTIMATION USING SINGLE-BIT DIGITAL-TO-ANALOG CONVERTER

(71) Applicant: QUALCOMM Incorporated, San Diego, CA (US)

(72) Inventors: Igor Gutman, Hod HaSharon (IL); Elias Dagher, Laguna Niguel, CA (US); Hua Wang, Basking Ridge, NJ (US); Behnam Sedighi, La Jolla, CA (US); Seyed Arash Mirhaj, Poway, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 245 days.

(21) Appl. No.: 18/470,309

(22) Filed: Sep. 19, 2023

(65) Prior Publication Data

US 2025/0096810 A1 Mar. 20, 2025

(51) Int. Cl.
| | |
|---|---|
| *H03M 1/12* | (2006.01) |
| *G06N 3/08* | (2023.01) |
| *H03M 1/06* | (2006.01) |

(52) U.S. Cl.
CPC ............ *H03M 1/0626* (2013.01); *G06N 3/08* (2013.01); *H03M 1/1245* (2013.01)

(58) Field of Classification Search
CPC ..... H03M 1/0626; H03M 1/1245; G06N 3/08
USPC .................................. 341/155, 144, 118, 120
See application file for complete search history.

(56) References Cited

U.S. PATENT DOCUMENTS

| | | | | |
|---|---|---|---|---|
| 8,309,933 | B1 * | 11/2012 | Wang ........................ | G01T 1/17 |
| | | | | 250/252.1 |
| 12,028,188 | B2 * | 7/2024 | Yu ......................... | H04L 27/367 |
| 2016/0211861 | A1 | 7/2016 | Op 'T Eynde et al. | |
| 2022/0045687 | A1 | 2/2022 | Kozlov et al. | |

OTHER PUBLICATIONS

Dolhansky B., "Artificial Neural Networks: Linear Regression (Part 1)", Jul. 10, 2013, pp. 1-10, XP093224627, Section "Training a neural network to perform linear regression".
International Search Report and Written Opinion—PCT/US2024/042771—ISA/EPO—Dec. 12, 2024.
Ren K., et al., "Octree-GS: Towards Consistent Real-time Rendering with LOD-Structured 3D Gaussians", IEEE, Transactions on Pattern Analysis and Machine Intelligence, arXiv:2403.17898v2 [cs.CV] Oct. 17, 2024, pp. 1-16.

* cited by examiner

*Primary Examiner* — Peguy Jean Pierre
(74) *Attorney, Agent, or Firm* — Polsinelli/Qualcomm

(57) ABSTRACT

A training signal generator for forming an input signal for an ADC-under-test includes a one-bit DAC and an analog low-pass filter. The one-bit DAC converts a binary sequence into a DAC output signal that is then filtered by the analog low-pass filter to form an ADC input signal. The ADC-under-test converts the ADC input signal into an ADC output signal. A digital low-pass filter converts the binary sequence into a plurality of samples. A digital signal processing system processes the plurality of samples and the ADC output signal to form an estimate of the ADC input signal. An ADC linearizer may then be trained to characterize a non-linear impairment of the ADC-under-test responsive to a comparison of the estimate of the ADC input signal and the ADC output signal.

26 Claims, 6 Drawing Sheets

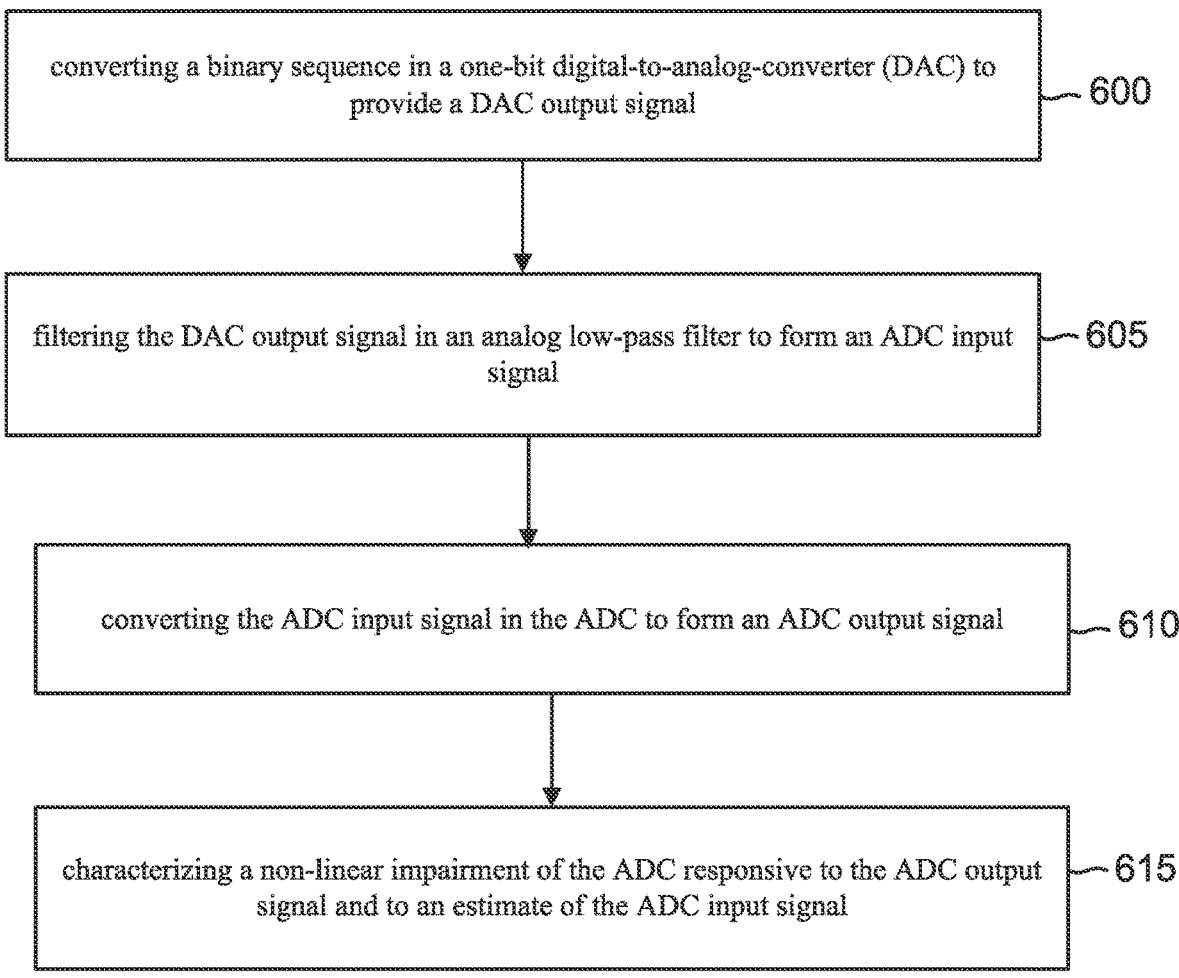

converting a binary sequence in a one-bit digital-to-analog-converter (DAC) to provide a DAC output signal ～600 filtering the DAC output signal in an analog low-pass filter to form an ADC input signal ～605 converting the ADC input signal in the ADC to form an ADC output signal ～610 characterizing a non-linear impairment of the ADC responsive to the ADC output signal and to an estimate of the ADC input signal ～615

FIG. 6

ANALOG-TO-DIGITAL CONVERTER NON-LINEARITY MODEL ESTIMATION USING SINGLE-BIT DIGITAL-TO-ANALOG CONVERTER

TECHNICAL FIELD

This application relates to analog-to-digital converters, and more particularly to a non-linear (NL) model estimation of an analog-to-digital converter (ADC).

BACKGROUND

The core processors in mobile devices operate in the digital domain. But wireless signals are analog signals. A receive path in a mobile device thus includes at least one ADC to convert the received wireless analog signals into a digital received signal. In modern telecommunications standards such as 5G or beyond, the dynamic range requirement of the ADCs is being pushed ever higher. For example, full-duplex or dynamic time-division duplex deployments require ever higher dynamic range requirements for the resulting ADCs. But the dynamic range of an ADC is limited by various non-linear impairments such as differential non-linearity, integral non-linearity, input non-linear response, sampling time jitter, successive-approximation register latency, resolution bandwidth, and other factors.

SUMMARY

In accordance with an aspect of the disclosure, a system for modeling non-linear impairments is provided that includes: an analog-to-digital converter (ADC) configured to convert an ADC input signal into an ADC output signal; a one-bit digital-to-analog converter (DAC) configured to convert a binary sequence into a DAC output signal; an analog low-pass filter configured to filter the DAC output signal to form the ADC input signal; and an at least one processor configured to configured to form an estimate of the ADC input signal.

In accordance with another aspect of the disclosure, a method of characterizing an analog-to-digital converter (ADC) is provided that includes: converting a binary sequence in a one-bit digital-to-analog-converter (DAC) to form a DAC output signal; filtering the DAC output signal in an analog low-pass filter to form an ADC input signal; converting the ADC input signal in the ADC to form an ADC output signal; and characterizing a non-linear impairment of the ADC responsive to the ADC output signal and to an estimate of the ADC input signal.

Finally, in accordance with yet another aspect of disclosure, a system is provided that includes: a training signal generator including a one-bit DAC and an analog low-pass filter configured to generate an ADC input signal; an ADC configured to convert the ADC input signal into an ADC output signal; and an ADC linearizer configured to characterize a non-linear impairment of the ADC responsive to the ADC output signal and an estimate of the ADC input signal.

These and other advantageous features may be better appreciated through the following detailed description.

BRIEF DESCRIPTION OF THE DRAWINGS

FIG. 6 is a flowchart for a method of modeling the non-linear impairments of an ADC in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Inevitable non-linearities in ADC performance limit the achievable dynamic range yet the need for increased dynamic range in applications such as wireless communication remains unabated. To address the non-linearities, an ADC linearizer may be used. The ADC linearizer uses a model of the ADC non-linearities as characterized during a training period using a training signal as the input signal to the ADC. The statistical properties of the training signal may be similar to the mission-mode radio frequency (RF) signal that will be processed by the ADC during a mission mode of operation to prevent mismatch and correction degradation. Based upon any non-linearities between an estimate of the training signal (the ADC input signal during the period) and the resulting ADC output signal, the ADC linearizer may then process the ADC output signal to rectify the non-linearity impairments.

Figure 1:
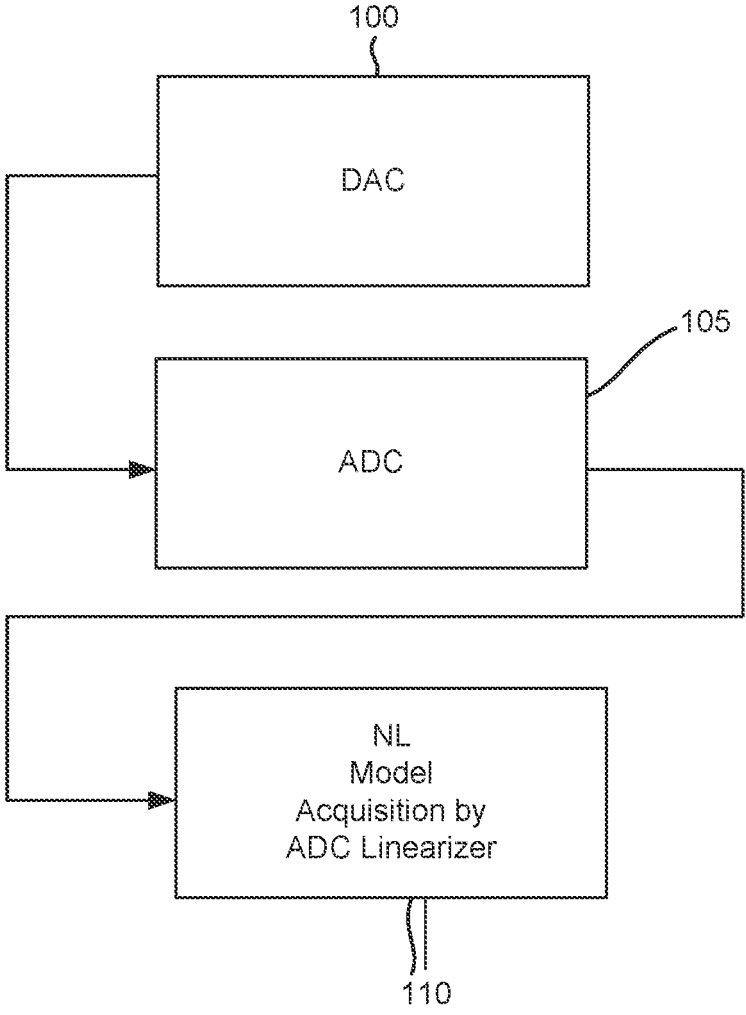
FIG. 1 illustrates a system in which the NL impairments of an ADC are difficult to evaluate separately from those of a DAC driving the ADC.

But forming an estimate of the training signal may be challenging. For example, suppose that a multi-bit digital-to-analog converter (DAC) 100 were used to generate the analog training signal as shown in FIG. 1. An ADC-under-test 105 then converts the analog training signal into digital samples. If the analog training signal were known, an ADC linearizer 110 may then process the digital samples and corresponding samples of the analog training signal to obtain a model of the non-linear (NL) impairments of the ADC 105. But note that the DAC 100 itself has non-linearities. The NL model acquisition by the ADC linearizer 110 is thus polluted by the DAC NL impairments and therefore inaccurate. Should the resulting degraded model of the NL impairments then be used to address the ADC impairments, little improvement or even worsened dynamic range may result.

Figure 2:
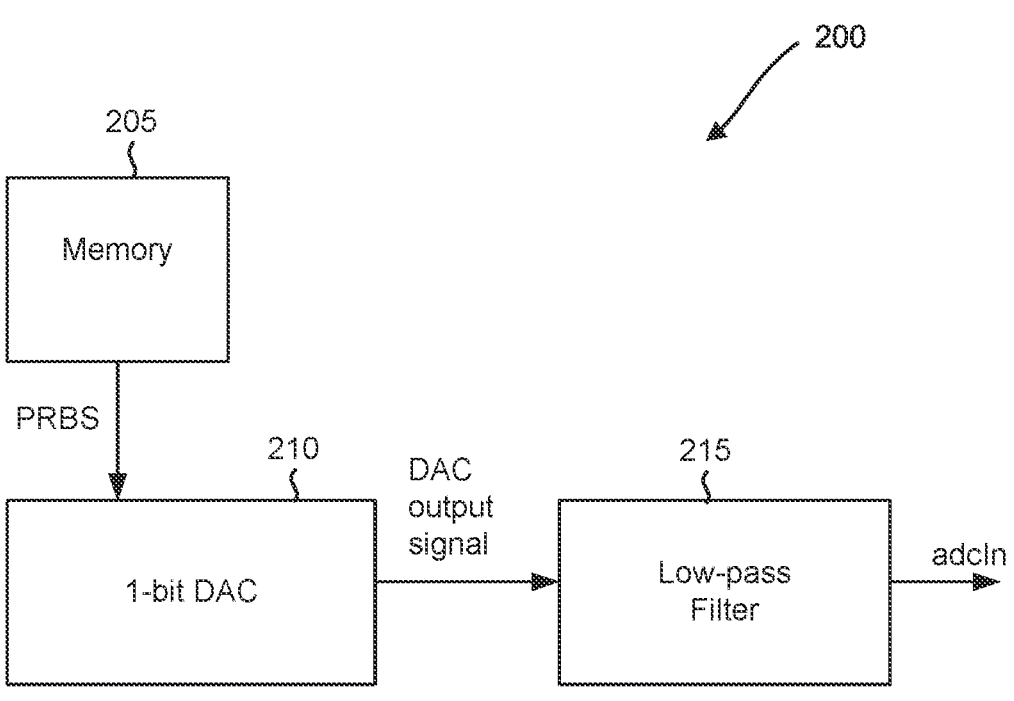
FIG. 2 illustrates a training signal generator for driving an ADC in which the non-linear impairments of a one-bit DAC in the training signal generator do not substantially affect the modeling of the non-linear impairments of the ADC in accordance with an aspect of the disclosure.

To address these issues, an advantageous one-bit DAC and analog low-pass filter is disclosed to generate the training signal (the ADC input signal). An example training signal generator 200 is shown in FIG. 2. A memory 205 stores a pseudo-random binary sequence (PRBS) that is delivered bit-by-bit to a one-bit DAC 210. An analog low-pass filter 215 then filters a DAC output signal from the DAC 210 to produce an analog ADC input signal (adcIn) for the ADC (not illustrated). Since the DAC 210 is a one-bit DAC, its DAC output signal will either equal a high value or a low value depending upon the binary value of the current bit from the pseudo-random sequence. The low-pass filter 215 then smooths the DAC output signal so that a bandwidth of the ADC input signal substantially matches a bandwidth of the ADC's mission-mode RF input signal. Should the ADC-under-test not be used for the conversion of a received RF signal in a wireless transceiver, the binary sequence may instead be based upon a low-frequency square wave or may be configured to have one or more characteristics that are similar to a signal which is likely to be input to the ADC during normal operation.

Although the one-bit DAC 210 is not perfect and thus has NL impairments, the non-linearity impact of the one-bit DAC 210 on the modeling of the NL impairments of the ADC is merely a root-mean-square offset and thus allows the ADC linearizer to characterize the ADC NL impairments with relative accuracy such that the effective dynamic range of the ADC may be advantageously increased. With respect to a characterization of the ADC NL impairments, there are two main implementations of the ADC linearizer. In a first implementation, the ADC linearizer uses an analytical approach in which the NL impairments are characterized using a predefined set of linear and/or non-linear kernels. Examples of such an analytical approach by the ADC linearizer include the use of Volterra filters, a polynomial Hammerstein system, a polynomial Weiner system, or other suitable analytical techniques. In a second implementation, the ADC linearizer uses a machine learning application such as a neural network that is trained to build a model of the ADC NL impairments. As compared to the analytical approach in which the NL impairments are estimated using a predefined set of linear and/or non-linear kernels, a machine learning application may more readily exploit the time correlation between samples of the ADC output signal. Regardless of whether the ADC linearizer uses an analytical approach or a machine learning application, the use of the training signal generator 200 to form the ADC training signal advantageously substantially prevents any NL impairments from the one-bit DAC 210 from affecting the characterization of the ADC NL impairments.

Figure 3:
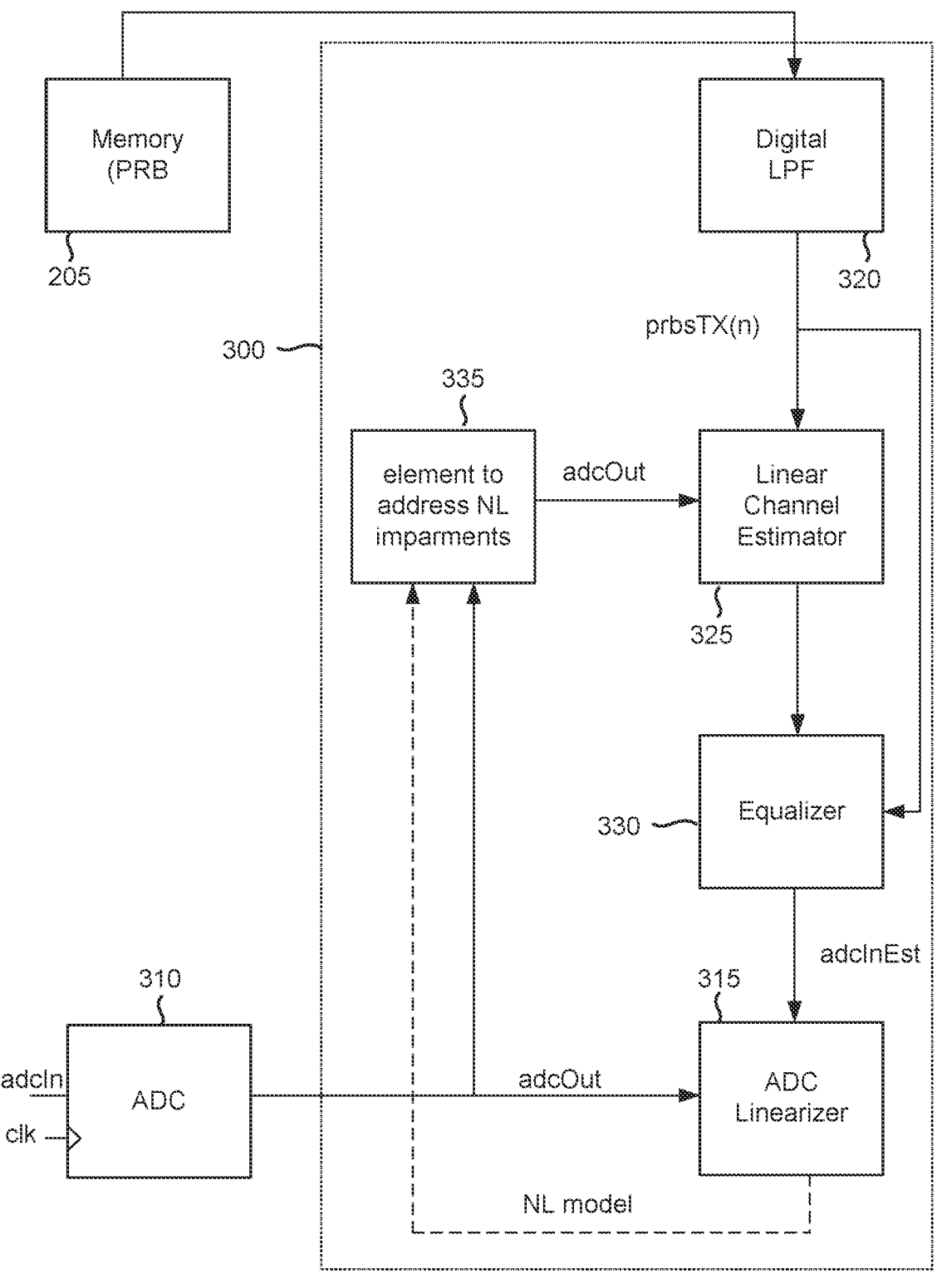
FIG. 3 illustrates a digital signal processing system such as an at least one processor configured to estimate an ADC input signal and to train a machine learning application to model the non-linear impairments of the ADC responsive to the estimate of the ADC input signal and the ADC output signal in accordance with an aspect of the disclosure.

Digital signal processing techniques may be used to estimate the ADC input signal during the training phase (estimating the training signal). An example digital signal processing system such as an at least one processor 300 is shown in FIG. 3. An ADC 310 that is being modeled digitizes the analog output signal from the low-pass filter 215 in the training signal generator 200 (FIG. 2) to produce an ADC output signal (adcOut). An ADC linearizer 315 (e.g., a neural network or an analytical approach) will be trained to model the unknown non-linear response or impairment of the ADC 310. To do so, the ADC linearizer 315 uses the ADC output signal and also an estimate (adcInEst) of the ADC input signal. With the ADC output signal being known and the ADC input signal being estimated, the ADC linearizer 315 may then characterize the ADC NL impairments. For example, if the ADC linearizer 315 is formed using a neural network, the neural network may be trained so as to build a model of the NL impairments of the ADC 310 based upon a comparison between the estimate of the ADC input signal and the ADC output signal.

With regard to making the estimate of the ADC input signal, note that in processing the pseudorandom binary sequence into the ADC input signal, the one-bit DAC 210 and the analog-low-pass filter 215 may be deemed to form a linear channel since the analog low-pass filter 215 is linear and the one-bit DAC 210 is substantially linear. The resulting linear channel is driving the ADC 310. Although the ADC 310 has NL impairments, the at least one processor 300 treats the combination of the training signal generator 200 and the ADC 310 as a linear channel as will be explained further herein. The output of this channel is known since the at least one processor 300 receives the ADC output signal. But the ADC input signal is not known and must be estimated as explained further herein.

The estimation of the channel coefficients of a linear channel may involve the use of a training sequence forming a convolution matrix. The training sequence drives the linear channel to produce an output vector y. For example, suppose that the convolution matrix is designated as A and the channel coefficients are designated as a vector x. The output vector y is then formed by the multiplication of the matrix A and the vector x as in the following Equation (1):

$$A \cdot x = y \qquad \text{Eq. (1)}$$

If both the matrix A and the output vector y are known, the channel coefficient vector x may be estimated to produce an estimated channel vector x from the following Equation (2):

$$\hat{x} = \left(A^H \cdot A\right)^{-1} \cdot A^H \cdot y \qquad \text{Eq. (2)}$$

where $A^H$ is the Hermitian or conjugate transpose of the matrix A. It may be shown that the resulting estimation leads to a minimum mean square error between $A\hat{x}$ and y. An advantageous adaptation of this minimum mean square error approach is disclosed herein to estimate a channel coefficient vector w for the linear channel formed by the combination of the one-bit DAC 210, the analog low-pass filter 215, and the ADC 310. With the channel coefficients w estimated, the ADC input signal may be estimated as discussed further herein.

To begin the estimate of the ADC input signal, a digital low-pass filter 320 receives the same binary sequence from memory 205 that is processed by the one-bit DAC 210. The digital low-pass filter 320 converts the binary sequence into a plurality of samples of a digital low-pass filter output signal. The digital low-pass filter 320 may be a finite impulse response filter (FIR) that filters the pseudorandom binary sequence (PRBS) to produce a plurality of n samples of the digital low-pass filter output signal (the presumed ADC input vector) designated as prbsTx(n), where n is plural positive integer. Ideally, the frequency response of the digital low-pass filter 320 substantially matches the frequency response of the analog low-pass filter 215. For example, the digital low-pass filter 320 may have substantially the same cutoff frequency and substantially the same drop-off rate as does the analog low-pass filter 215 but it will be appreciated that the digital low-pass filter 320 may instead have an arbitrary frequency response as compared to the analog low-pass filter 215. Ideally, the samples of the digital low-pass filter output signal are substantially equal to digital versions of the corresponding samples of the ADC input signal that are then digitized by the ADC 310.

Figure 4:
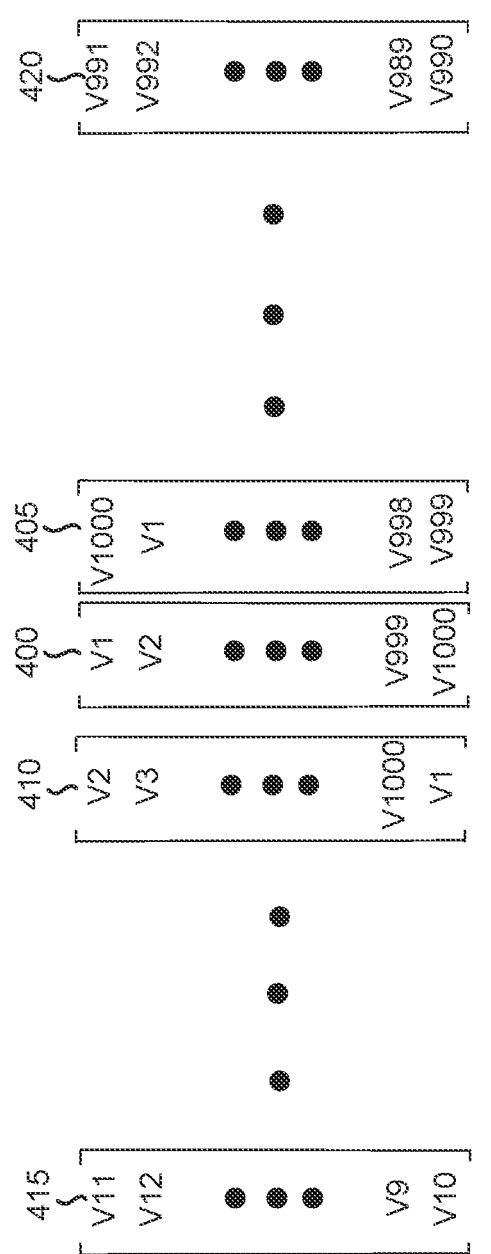
FIG. 4 illustrates a matrix used by the digital signal processing system of FIG. 3 in accordance with an aspect of the disclosure.

A linear channel estimator 325 may construct a matrix K of delayed versions of the plurality of samples prbsTx(n) of the digital low-pass filter output signal. The plurality of n samples of the digital low-pass filter output signal (prbsTx (n)) is the center vector in the matrix K. Each successive column in the matrix K is delayed by one sample with respect to its preceding column. In general, the matrix K may have 2N+1 columns (N being a plural positive integer). The integer N is selected so that the matrix K has a sufficient number of columns to form a convolution matrix analogous to that of Equation (1). If each column has 1000 samples and N equals 10, the resulting matrix K may be as shown in FIG. 4. In this example, the vector prbsTx(n) forms a center column 400 that includes 1000 samples of the digital low-pass filter output signal arranged from a first sample V1 to a final sample V1000. A subsequent column 405 in the matrix K would then range from the sample V1000 followed by a series of the first sample V1 to a 999$^{th}$ sample V999. This one-sample-delayed vector may be designated as prbsTx(n−1). A preceding column 410 to column 400 has a negative one-sample-delay and thus ranges from a second sample V2 to the 1000$^{th}$ sample V1000 followed by the first sample V1. If each column has 1000 samples and N equals 10 (the matrix K thus having 21 columns), an initial column 415 begins with an eleventh sample V11 through the final sample V1000 followed by a series of the first sample through a tenth sample V10. It may be seen that from one column to the subsequent column, the samples are shifted in a modulo-n fashion. A final column 420 thus begins with a series of the 991$^{st}$ sample V991 through V1000 followed by a series of the first sample V1 through the 990$^{th}$ sample V990.

ADC 310 samples the ADC input signal responsive to cycles of a clock signal clk. Each sample in the presumed ADC input vector prbsTx(n) may thus be viewed as a presumed digital version of samples of the ADC input signal taken by the ADC 310. To process the matrix K of these presumed samples to obtain the plurality of channel coefficients vector w, linear channel estimator 325 may perform the estimation according to the following equation (3):

$$w = \left( K^H \cdot K + \epsilon \cdot I \right)^{-1} \cdot K^H \cdot adcOut \qquad \text{Eq. (3)}$$

Comparing Equation (2) to Equation (3), it may be seen that the channel coefficient estimation has been enhanced to include the addition of a product of a parameter e and the identity matrix I, where the parameter e may be adjusted to ease the computation burden of inverting the matrix formed by the product of $K^H$ and K, and where H is again the Hermitian operator.

With the plurality of channel coefficients vector w estimated, an equalizer 330 may multiply the presumed ADC input vector prbsTx(n) using the channel coefficient vector w to determine the samples of the estimated ADC input signal adcInEst. In particular, the equalizer 330 may multiply the matrix K with the plurality of channel coefficients vector w to obtain a digital estimation adcInEst of the ADC input signal as by the following Equation (4):

$$adcInEst = K \cdot W \qquad \text{Eq. (4)}$$

Note the difference between the channel estimation of Equations (1) and (2) versus the estimation of the ADC input signal using Equations (3) and (4). In Equations (1) and (2), the input to the channel and the output of the channel are both known. An example of this would be the use of known reference signals in the wireless communication arts such as in the Fifth Generation protocol (5G). Since both the transmitted reference signals and what was actually received are known, a network node may then calculate the channel coefficients so that the wireless signals may be adapted accordingly. But for the processor 300, both the channel coefficients and the ADC input signal are unknown. This problem is then advantageously addressed through the use of the presumed ADC input signal prbsTx(n) as generated by the digital low-pass filter 320 in response to the same binary sequence as processed by the training signal generator 200. In this fashion, the channel coefficients may then be estimated such as through the use of Equation (3). With the channel coefficients calculated, the presumed ADC input signal prbsTx(n) may then be equalized such as set forth by Equation (4) to recover the digital estimation adcInEst of the ADC input signal.

A potential issue with this digital estimation is that the non-linear impairments of the ADC 310 could affect the accuracy of the channel coefficient calculations. But note that the channel coefficient calculations are based upon a least means square approach, which is inherently a linear solution. With a sufficiently large number of samples of the digital low-pass filter signal to form the vector prbsTx(n), the projection of the non-linear impairment of the ADC 310 onto the channel coefficient calculation may be substantially zero. In one implementation, the sufficient number of samples was 1000 samples but it will be appreciated that fewer or greater number of samples may be used in alternative implementations. With a sufficient number of samples, the channel coefficient calculation may thus be substantially free of the ADC non-linear impairments. With the estimated ADC input signal adcInEst being determined and the ADC output signal adcOut being known, the ADC linearizer 315 may proceed to characterize the non-linear impairment of the ADC 310. The characterization of the non-linear impairment using an analytical approach and the training of a machine learning application such as a neural network is known to those of ordinary skill in the art so this characterization will not be discussed further herein.

Although the non-linear impairments of the ADC 310 may be processed out from the channel coefficient calculation through the use of a sufficient number of samples, it is possible that the non-linear impairments may be so severe that merely using a sufficiently large number of samples does not eliminate the NL impairment of the channel coefficient calculation. The at least one processor 300 may thus perform iterations of the estimation of the ADC input signal. An initial iteration may proceed according to Equations (3) and (4) as discussed above so that the ADC linearizer 315 may perform an initial estimation of the non-linear impairment model. In a second iteration, the digital signal processing system 300 includes an element 335 that processes the ADC output signal ADCout to remove the effect of the non-linear impairments identified in the first iteration to form a revised ADC output signal. The linear channel estimator 325 may then re-calculate the channel coefficients according to Equation (3) using the revised ADC output signal from the element 335 to provide a revised plurality of channel coefficients. From the revised plurality of channel coefficients and the matrix K, the equalizer 330 may then proceed to calculate a revised estimated ADC input signal adcInEst. If necessary, the processor 300 may proceed to perform additional iterations. However, it has been observed that for generally-expected levels of non-linear impairments in some example ADCs, a single iteration through digital signal processing system 300 will sufficiently estimate the ADC input signal adcInEst.

Figure 5:
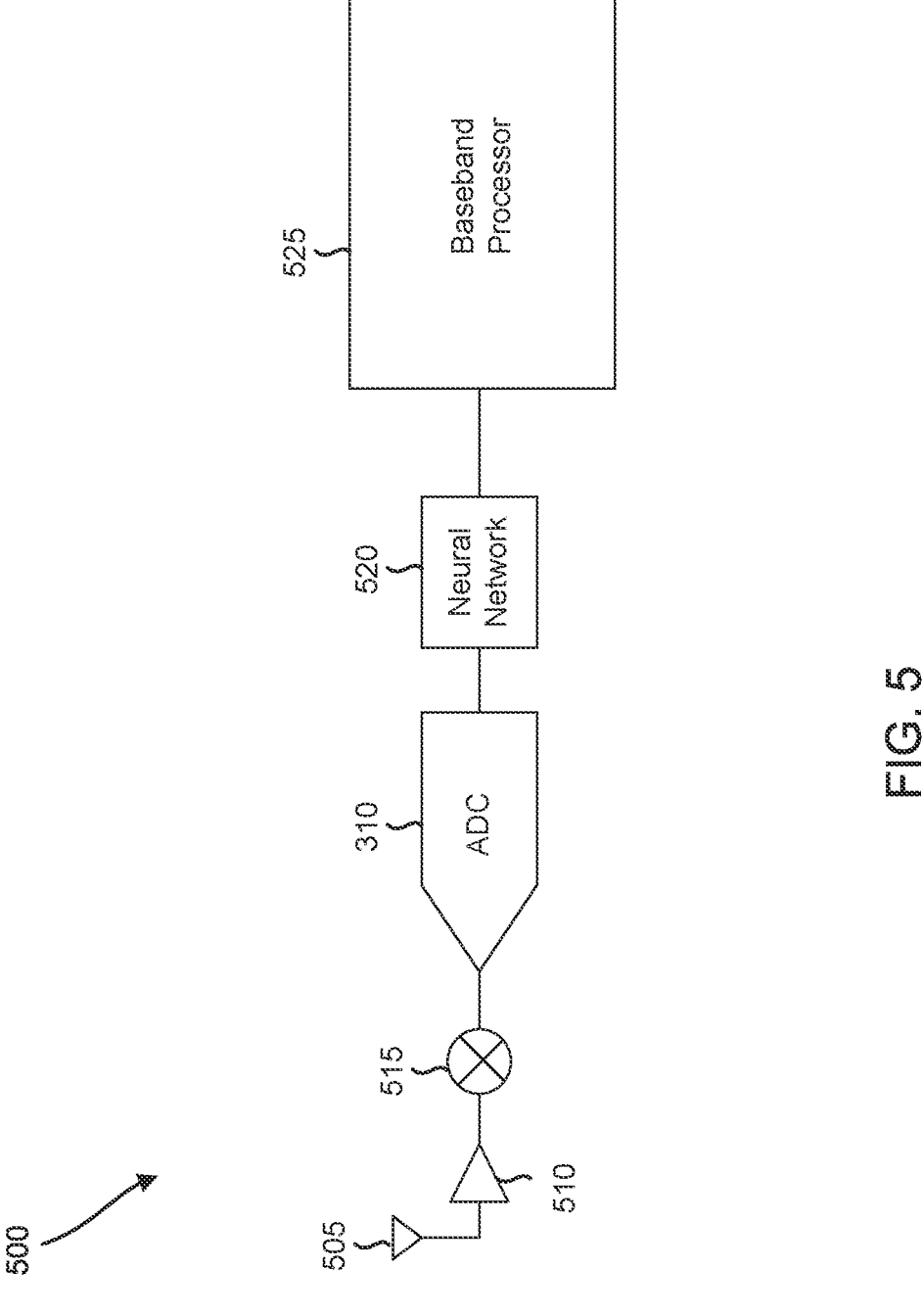
FIG. 5 illustrates the receive path of a transceiver in which an ADC is linearized by a neural network in accordance with an aspect of the disclosure.

ADC 310 may be incorporated into the receive path 500 of a transceiver as shown in FIG. 5. An RF signal is received at one or more antennas 505 and then amplified such as through a low-noise amplifier 510. The RF signal may then be down-converted to baseband frequency in one or more mixers 515 before being digitized by the ADC 310. Prior to this mission mode operation, the training signal generator 200 (FIG. 2) drives the ADC 310 so that a neural network 520 may be trained to develop a model of the non-linear impairments of the ADC 310. For example, the neural network 520 may be an example of or implemented by or within the ADC linearizer 315. During the mission mode of operation, the neural network 520 may then linearize the ADC output signal from the ADC 310 responsive to the model. In this fashion, the dynamic range of the ADC 310 is maximized. A baseband processor 525 may then recover the digital information from the ADC output signal as corrected by the neural network 520. It will be appreciated that the receive path 500 is shown in simplified form and may include assorted other elements such as filters, phase-shifters, and additional amplifiers. In addition, the ADC 310 need not be located at baseband but may instead digitize an intermediate frequency received signal such as performed in direct down-conversion architectures. Further, while the neural network 520 is illustrated as being separate from the baseband processor 525, in some examples the neural network is included in the baseband processor 525.

A method of modeling the non-linearities of an ADC will now be discussed with regard to the flowchart of FIG. 6. The method includes an act 600 of converting a binary sequence in a one-bit digital-to-analog-converter (DAC) to form a DAC output signal. The converting of the pseudorandom binary sequence by the one-bit DAC 210 into the DAC output signal is an example of act 600. The method also includes an act 605 of filtering the DAC output signal in an analog low-pass filter to form an ADC input signal. The filtering of the DAC output signal in the analog low-pass filter 215 is an example of act 605. In addition, the method includes an act 610 of converting the analog ADC input signal to the ADC to form a digital ADC output signal. The converting of the ADC input signal by the ADC 310 is an example of act 610. Finally, the method includes an act 615 of characterizing a non-linear impairment of the ADC responsive to the ADC output signal and to an estimate of the ADC input signal. The estimation of the ADC input signal by the processor 300 and the subsequent training of the neural network 520 is an example of act 615.

Advantages may include an ADC having greater linearity, and reduced quantization errors, for example such that ADC steps are more uniform. Accuracy and/or an effective number of bits that can be processed may be improved. Further, costs may be reduced as compared to other strategies for calibrating an ADC, for example by obviating the need for certain calibration hardware in the core of the ADC. Eliminating such calibration hardware may further increase a speed of operation of the ADC in some configurations.

The disclosure will now be summarized in the following series of clauses:

Clause 1. A system for modeling non-linear impairments, comprising:

an analog-to-digital converter (ADC) configured to convert an ADC input signal into an ADC output signal;

a one-bit digital-to-analog converter (DAC) configured to convert a binary sequence into a DAC output signal;

an analog low-pass filter configured to filter the DAC output signal to form the ADC input signal; and an at least one processor configured to form an estimate of the ADC input signal.

Clause 2. The system of clause 1, further comprising:

a memory configured to store the binary sequence.

Clause 3. The system of any of clauses 1-2, wherein the binary sequence is a pseudorandom binary sequence.

Clause 4. The system of any of clauses 1-3, further comprising:

a digital low-pass filter configured to convert the binary sequence into a plurality of samples of a digital low-pass filter output signal.

Clause 5. The system of clause 4, wherein the at least one processor is further configured to process the plurality of samples of the digital low-pass filter output signal with the ADC output signal to generate a plurality of channel coefficients.

Clause 6. The system of clause 5, wherein the plurality of samples of the digital low-pass filter output signal comprises approximately 1000 samples.

Clause 7. The system of any of clauses 5-6, wherein the at least one processor is further configured to process the plurality of samples of the digital low-pass filter output signal with the plurality of channel coefficients to generate the estimate of the ADC input signal.

Clause 8. The system of clause 7, wherein the at least one processor is further configured to process the plurality of samples of the digital low-pass filter output signal with the plurality of channel coefficients to generate the estimate of the ADC input signal through a convolution of the plurality of samples of the digital low-pass filter output signal with the plurality of channel coefficients.

Clause 9. The system of clause 7, further comprising:

an ADC linearizer configured to linearize the ADC output signal responsive to a model of the non-linear impairments of the analog-to-digital converter to provide a revised ADC output signal.

Clause 10. The system of clause 9, wherein the at least one processor is further configured to:

process the plurality of samples of the digital low-pass filter output signal with the revised ADC output signal to generate a revised plurality of linear channel coefficients;

process the plurality of samples of the digital low-pass filter output signal with the revised plurality of linear channel coefficients to generate a revised estimate of the ADC input signal; and re-train the ADC linearizer to provide a revised model of the non-linear impairments of the analog-to-digital converter responsive to the revised ADC output signal and to the revised estimate of the ADC input signal.

Clause 11. The system of any of clauses 1-10, wherein the analog-to-digital converter is included within a transceiver, the analog-to-digital converter being configured to digitize a received baseband signal from the transceiver during a mission mode of operation.

Clause 12. The system of clause 11, further comprising a neural network configured to linearize the ADC output signal during the mission mode of operation, wherein the neural network is trained based on the estimate of the ADC input signal.

Clause 13. The system of clause 9, wherein the ADC linearizer comprises a machine learning application configured to linearize an output signal from the analog-to-digital converter responsive to the model of the non-linear impairments during a mission mode of operation.

Clause 14. The system of clause 4, wherein a cutoff frequency of the digital low-pass filter is substantially equal to a cutoff frequency of the analog low-pass filter.

Clause 15. The system of clause 14, wherein a drop-off rate of the digital low-pass filter is substantially equal to a drop-off rate of the analog low-pass filter.

Clause 16. The system of clause 13, wherein the machine learning application comprises a neural network.

Clause 17. A method of characterizing an analog-to-digital converter (ADC), comprising:

converting a binary sequence in a one-bit digital-to-analog-converter (DAC) to form a DAC output signal;

filtering the DAC output signal in an analog low-pass filter to form an ADC input signal;

converting the ADC input signal in the ADC to form an ADC output signal; and characterizing a non-linear impairment of the ADC responsive to the ADC output signal and to an estimate of the ADC input signal.

Clause 18. The method of clause 17, further comprising:

processing the binary sequence through a digital low-pass filter to provide a plurality of samples of a digital low-pass filter output signal;

processing the plurality of samples of the digital low-pass filter output signal with the ADC output signal to provide a plurality of channel coefficients; and processing the plurality of samples of the digital low-pass filter output signal with the plurality of channel coefficients to provide the estimate of the ADC input signal.

Clause 19. The method of clause 18, wherein processing the plurality of samples of the digital low-pass filter output signal with the ADC output signal comprises:

forming a matrix extending from an initial column to a final column, wherein each subsequent column of the matrix is a one-sample-delayed version of a preceding column in the matrix, and wherein the plurality of samples of the digital low-pass filter output signal forms a center column of the matrix; and processing the matrix with the ADC output signal to provide the plurality of channel coefficients.

Clause 20. The method of clause 19, wherein processing the plurality of samples of the digital low-pass filter output signal with the plurality of channel coefficients comprises multiplying the matrix with the plurality of channel coefficients.

Clause 21. A system, comprising:

a training signal generator including a one-bit DAC and an analog low-pass filter configured to generate an ADC input signal;

an ADC configured to convert the ADC input signal into an ADC output signal; and an ADC linearizer configured to characterize non-linear impairments of the ADC responsive to the ADC output signal and an estimate of the ADC input signal.

Clause 22. The system of clause 21, further comprising:

a memory for storing a binary sequence, wherein the one-bit DAC is configured to convert the binary sequence into a DAC output signal, and wherein the analog low-pass filter is configured to filter the DAC output signal to generate the ADC input signal.

Clause 23. The system of clause 22, wherein the binary sequence is a pseudorandom sequence.

Clause 24. The system of any of clauses 22-23, further comprising:

a digital low-pass filter configured to convert the binary sequence into a plurality of samples of a digital low-pass filter output signal; and an at least one processor configured to generate the estimate of the ADC input signal responsive to the plurality of samples of the digital low-pass filter output signal and to the ADC output signal.

Clause 25. The system of any of clauses 21-24, wherein the ADC linearizer comprises a machine learning application.

Clause 25. The system of clause 25, wherein the machine learning application comprises a neural network.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A system for modeling non-linear impairments, comprising:

an analog-to-digital converter (ADC) in a receive path of a device, the ADC configured to convert an ADC input signal into an ADC output signal;

a one-bit digital-to-analog converter (DAC) configured to convert a binary sequence into a DAC output signal, wherein the one-bit DAC is configured to receive the binary sequence one bit at a time and provide a respective analog output for each bit of the binary sequence;

an analog low-pass filter configured to filter the DAC output signal from the one-bit DAC to form the ADC input signal; and at least one processor configured to form an estimate of the ADC input signal.

2. The system of claim 1, further comprising:

a memory configured to store the binary sequence.

3. The system of claim 2, wherein the binary sequence is a pseudorandom binary sequence.

4. The system of claim 1, further comprising:

a digital low-pass filter configured to convert the binary sequence into a plurality of samples of a digital low-pass filter output signal.

5. The system of claim 4, wherein the at least one processor is further configured to process the plurality of samples of the digital low-pass filter output signal with the ADC output signal to generate a plurality of channel coefficients.

6. The system of claim 5, wherein the plurality of samples of the digital low-pass filter output signal comprises approximately 1000 samples.

7. The system of claim 5, wherein the at least one processor is further configured to process the plurality of samples of the digital low-pass filter output signal with the plurality of channel coefficients to generate the estimate of the ADC input signal.

8. The system of claim 7, wherein the at least one processor is further configured to process the plurality of samples of the digital low-pass filter output signal with the plurality of channel coefficients to generate the estimate of the ADC input signal through a convolution of the plurality of samples of the digital low-pass filter output signal with the plurality of channel coefficients.

9. The system of claim 7, further comprising:

an ADC linearizer configured to linearize the ADC output signal responsive to a model of the non-linear impairment of the analog-to-digital converter to provide a revised ADC output signal.

10. The system of claim 9, wherein the at least one processor is further configured to:

process the plurality of samples of the digital low-pass filter output signal with the revised ADC output signal to generate a revised plurality of linear channel coefficients;

process the plurality of samples of the digital low-pass filter output signal with the revised plurality of linear channel coefficients to generate a revised estimate of the ADC input signal; and re-train the ADC linearizer to provide a revised model of the non-linear impairments of the analog-to-digital converter responsive to the revised ADC output signal and to the revised estimate of the ADC input signal.

11. The system of claim 9, wherein the ADC linearizer comprises a machine learning application configured to linearize an output signal from the analog-to-digital converter responsive to the model of the non-linear impairments during a mission mode of operation.

12. The system of claim 11, wherein the machine learning application comprises a neural network.

13. The system of claim 1, wherein the analog-to-digital converter is included within a transceiver, the analog-to-digital converter being configured to digitize a received baseband signal from the transceiver during a mission mode of operation.

14. The system of claim 13, further comprising a neural network configured to linearize the ADC output signal during the mission mode of operation, wherein the neural network is trained based on the estimate of the ADC input signal.

15. The system of claim 4, wherein a cutoff frequency of the digital low-pass filter is substantially equal to a cutoff frequency of the analog low-pass filter.

16. The system of claim 15, wherein a drop-off rate of the digital low-pass filter is substantially equal to a drop-off rate of the analog low-pass filter.

17. A method of characterizing an analog-to-digital converter (ADC), comprising:

converting a binary sequence in a one-bit digital-to-analog-converter (DAC) to form a DAC output signal, wherein the one-bit DAC is configured to receive the binary sequence one bit at a time and provide a respective analog output for each bit of the binary sequence;

filtering the DAC output signal from the one-bit DAC in an analog low-pass filter to form an ADC input signal;

converting the ADC input signal in the ADC to form an ADC output signal; and characterizing a non-linear impairment of the ADC responsive to the ADC output signal and to an estimate of the ADC input signal.

18. The method of claim 17, further comprising:

processing the binary sequence through a digital low-pass filter to provide a plurality of samples of a digital low-pass filter output signal;

processing the plurality of samples of the digital low-pass filter output signal with the ADC output signal to provide a plurality of channel coefficients; and processing the plurality of samples of the digital low-pass filter output signal with the plurality of channel coefficients to provide the estimate of the ADC input signal.

19. The method of claim 18, wherein processing the plurality of samples of the digital low-pass filter output signal with the ADC output signal comprises:

forming a matrix extending from an initial column to a final column, wherein each subsequent column of the matrix is a one-sample-delayed version of a preceding column in the matrix, and wherein the plurality of samples of the digital low-pass filter output signal forms a center column of the matrix; and processing the matrix with the ADC output signal to provide the plurality of channel coefficients.

20. The method of claim 19, wherein processing the plurality of samples of the digital low-pass filter output signal with the plurality of channel coefficients comprises multiplying the matrix with the plurality of channel coefficients.

21. A system, comprising:

a training signal generator including a one-bit DAC and an analog low-pass filter configured to generate an ADC input signal, wherein the one-bit DAC is configured to receive a binary sequence one bit at a time and provide a respective analog output for each bit of the binary sequence;

an ADC configured to convert the ADC input signal into an ADC output signal; and an ADC linearizer configured to characterize a non-linear impairment of the ADC responsive to the ADC output signal and an estimate of the ADC input signal.

22. The system of claim 21, further comprising:

a memory for storing a binary sequence, wherein the one-bit DAC is configured to convert the binary sequence into a DAC output signal, and wherein the analog low-pass filter is configured to filter the DAC output signal to generate the ADC input signal.

23. The system of claim 22, wherein the binary sequence is a pseudorandom sequence.

24. The system of claim 22, further comprising:

a digital low-pass filter configured to convert the binary sequence into a plurality of samples of a digital low-pass filter output signal; and an at least one processor configured to generate the estimate of the ADC input signal responsive to the plurality of samples of the digital low-pass filter output signal and to the ADC output signal.

25. The system of claim 21, wherein the ADC linearizer comprises a machine learning application.

26. The system of claim 25, wherein the machine learning application comprises a neural network.

* * * * *